United States Patent
Arz et al.

(10) Patent No.: US 6,741,152 B1
(45) Date of Patent: May 25, 2004

(54) DIRECTLY COOLED MAGNETIC COIL, PARTICULARLY A GRADIENT COIL, AND METHOD FOR MANUFACTURING CONDUCTORS THEREFOR

(75) Inventors: Winfried Arz, Erlangen (DE); Stefan Stocker, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 411 days.

(21) Appl. No.: 09/388,582

(22) Filed: Sep. 2, 1999

(30) Foreign Application Priority Data

Sep. 2, 1998 (DE) .......................... 198 39 987

(51) Int. Cl.[7] .............................. H01F 5/00
(52) U.S. Cl. .................. 335/300; 336/62; 174/15.1; 174/15.6; 174/47
(58) Field of Search ............. 174/15.1, 15.5, 174/15.6, 47; 335/300; 336/62

(56) References Cited

U.S. PATENT DOCUMENTS

| | | | |
|---|---|---|---|
| 2,497,516 A | * 2/1950 | Phelps | 336/62 |
| 3,946,349 A | * 3/1976 | Haldeman, III | 336/62 |
| 4,577,175 A | 3/1986 | Burgher et al. | 336/61 |
| 4,593,261 A | 6/1986 | Forster et al. | 335/300 |
| 5,068,491 A | 11/1991 | Ogata et al. | 174/16.2 |
| 5,430,274 A | * 7/1995 | Couffet et al. | 219/677 |
| 5,438,182 A | 8/1995 | Choi | 219/702 |

FOREIGN PATENT DOCUMENTS

| | | |
|---|---|---|
| DE | 25 44 275 | 1/1975 |
| DE | 34 45 448 A1 | 12/1984 |
| EP | 0 896 228 A1 | 7/1998 |

OTHER PUBLICATIONS

Printout of Online Abstract for Japanese Patent 55–70015, 5/80.

* cited by examiner

*Primary Examiner*—Ramon M. Barrera
(74) *Attorney, Agent, or Firm*—Schiff Hardin LLP

(57) ABSTRACT

A directly cooled magnetic coil, particularly a gradient coil for a magnetic resonance apparatus, has the conductors forming the windings which are provided with an inner cooling channel for conducting a cooling fluid therethrough, and the conductors are fashioned as profiled segment conductors whose individual profiled segments surround a cooling tube. The cooling tube is composed of material that is not electrically conductive, or is only slightly electrically conductive, particularly a flexible plastic.

6 Claims, 5 Drawing Sheets

DIRECTLY COOLED MAGNETIC COIL, PARTICULARLY A GRADIENT COIL, AND METHOD FOR MANUFACTURING CONDUCTORS THEREFOR

BACKGROUND OF THE INVENTION

1. Field of the Invention

The present invention is directed to a directly cooled magnetic coil, particularly a gradient coil for a magnetic resonance apparatus. The invention is also directed to a method for manufacturing conductors for a directly cooled magnetic coil.

2. Description of the Prior Art

In order to assure operation below a maximally allowed temperature of the gradient coil, it is necessary to designationally and efficiently eliminate the electrical dissipated power that arises in the form of heat. Since a dissipated power on the order of magnitude of more than 20 kW can be involved, considerable demands are made on the cooling system employed for this purpose.

German OS 34 45 448 discloses a gradient coil that is composed of two individual coils electrically connected in series. The individual coils are arranged in housing walls of a coil housing that lie opposite one another such that a free space remains for use as a cooling channel between the individual coils.

European Application 0 896 228 discloses an actively shielded gradient coil system with primary and shielding coils. Cooling tubes are located between these coils.

U.S. Pat. No. 5,068,491 discloses a rigid conductor for a power supply with coolant channels.

German OS 25 44 275 discloses a fluid-cooled induction coil. At least one further, inner waveguide is arranged within an outer waveguide. The interspace between the outer and inner waveguide has a fluid therethrough.

The provision of a cooling channel in the electrical conductor for the turns of the gradient coil requires a complete insulation of the coolant circulation path due to the high, and partially different voltages, in the region of the gradient coil and, given employment of water as the coolant, requires the use of highly distilled, non-conductive (i.e., non-ionized) water, which, of course, makes the operation extremely complicated and expensive. Given the high voltages and the direct contact between the water and the metallic conductors, an ionic contamination occurs after a relatively short time, and thus, the water becomes conductive, which absolutely must be avoided because of the risk of high-voltage arcing.

SUMMARY OF THE INVENTION

An object of the present invention is to provide a directly cooled magnetic coil of the type initially described wherein a simple operation is possible using non-processed water, as well as to provide a method for manufacturing conductors for such a directly cooled magnetic coil.

These objects are inventively achieved in a magnetic coil wherein the conductors are fashioned as profiled segment conductors whose individual profiled segments surround a cooling tube made of material that is electrically non-conductive, or only slightly conductive, particularly flexible plastic.

Due to the inventive structure of the coil, the cooling fluid is completely isolated from the inside wall of the electrical conductor to be cooled, so that if water is used as the coolant, it is not important whether the water has a more or less high electrical conductivity due to natural contaminants. A quasi-direct cooling of the conductors of the coil windings by the coolant takes place that is only slightly impeded by the small wall thickness of the electrically insulating cooling tubes, so that a very efficient cooling is established that opposes an excessive heating of the magnetic coil. Due to the small space requirement of an inventively constructed gradient coil compared to known versions with direct cooling and high, complicated outside insulation, or indirect cooling with cooling coils surrounding the gradient turns, the gradient coil windings can be positioned at more extreme radial distances, allowing an additional efficiency gain in the field generation. The elimination of water conditioning measures for lowering the specific electrical conductivity and for minimizing corrosion effects on the conductor material simplifies the operation of an inventively constructed, directly cooled magnetic coil and makes it less expensive.

The structure of the conductors for an inventive, directly cooled magnetic coil can include as the conductor segments, individual strands twisted with one another to form a stranded conductor that surrounds the cooling tube. The manufacture of such a conductor can preferably ensue by spinning the individual conductors around the cooling tube.

A design which has proven particularly advantageous in extensive tests on which the present invention is based has profiled segments in the form of rectangular (in cross-section) rods each having a channel with a semicircular cross-section, surrounding the cooling tube and positively locked thereto. Such a structure can be manufactured in an extremely simple way, since the rectangular conductors correspond to the profile shape that is standard for highly stressed gradient coils and can be easily laid via templets. Further individual conductors, i.e. solid conductors as well as stranded conductors, can be applied onto the outside surfaces of the profiled segments in order to enhance the effective conductor areas.

According to a further embodiment of the invention, at least some of the conductor segments applied at the cooling tube can be at in the form of retaining, embracing mounting webs which are mounted to, and at least partially surround, the cooling tube. For example, longitudinal webs which are offset relative to one another by 180° can be applied to the cooling tube with a number of hooked cross-webs, spaced from each other, being attached to each longitudinal web. This embodiment yields a flexible plastic part, so that bending of the finished conductor is possible without problems. The actual conductor segments composed, for example, of copper can, of course, already be bent with good shape retention.

In a further embodiment of the invention, lateral tube profiles which respectively accept a profiled segment in a positively locked fashion are applied to the cooling tube, which in this embodiment preferably has a rectangular cross-section. These lateral tube profiles also preferably have a rectangular cross-section and form a smooth, rectangular outside contour. As warranted, parallel, spaced slots can thereby be provided in the walls of the lateral tube profiles that form the outside contour in order, similar to the exemplary embodiment described above having the spaced cross-webs, to enable a simple, shape-retaining bending of the finished conductors.

The manufacture of such coil conductor having profiled segments arranged in lateral tube profiles of the cooling tube can ensue very simply by coating or extrusion processes using thermoplastic plastics.

DESCRIPTION OF THE PREFERRED EMBODIMENTS

Figure 1:
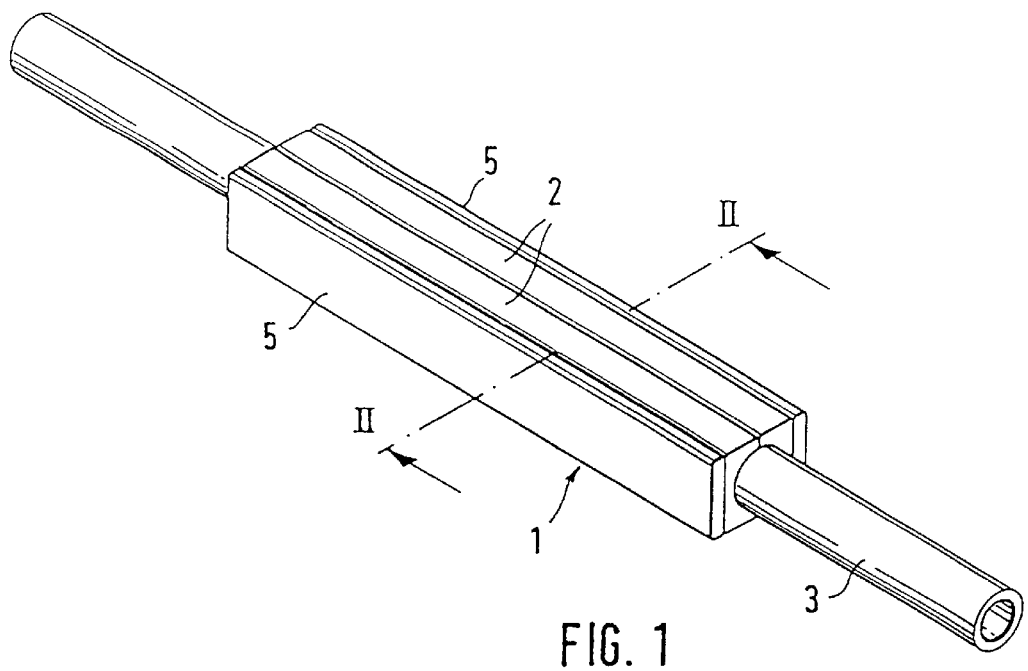
FIG. 1 is a simplified, perspective view of a cooling tube surrounded by two conductor segments in accordance with the invention.
Figure 2:
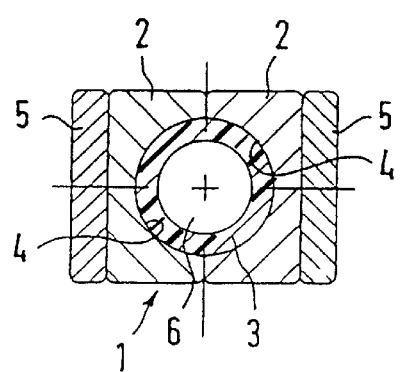
FIG. 2 is an enlarged section along the line II—II in FIG. 1.

In the exemplary embodiment according to FIGS. 1 and 2, the profiled segment conductor 1 is composed of two profiled segments 2 fashioned as rectangular rods each having a channel 4 with a semicircular cross-section surrounding, for example, a cooling tube 3 composed of plastic, in locking fashion. In the exemplary embodiment shown in FIGS. 1 and 2, wherein the two profiled segments can move relative to one another so that the conductor 1 can be bent with a tight radius of curvature, two further individual conductors 5 are provided in addition to the two profiled segments 2. These two further individual conductors 5 are applied onto the respective outside surfaces of the profiled segments 2 in order to enhance the effective conductor area. These additional individual conductors 5 alternatively can be fashioned with a structured surface or, for example, as stranded conductors.

Figure 3:
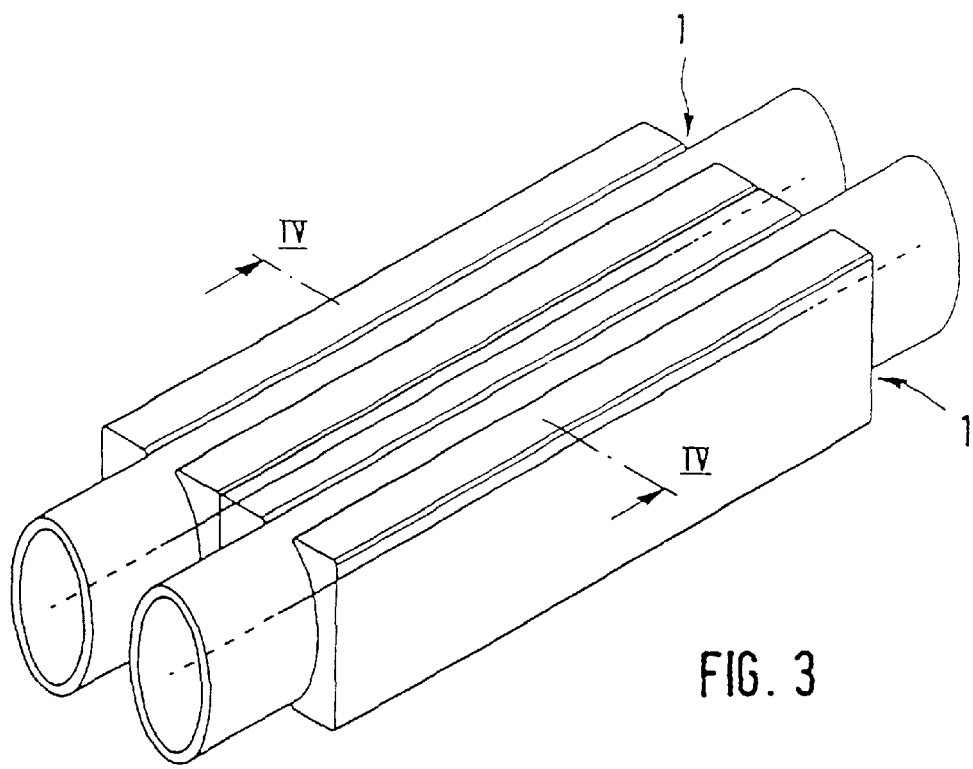
FIG. 3 is a perspective view of a double conductor constructed of two conductors with insulated cooling channels according to FIG. 1.
Figure 4:
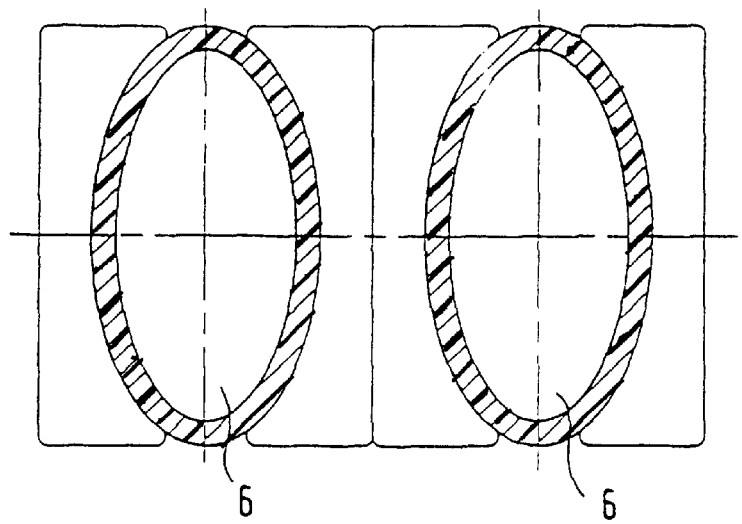
FIG. 4 is an enlarged section along the line IV—IV in FIG. 3.

FIGS. 3 and 4 show a double conductor composed of two conductors 1 arranged next to one another and provided with an interior cooling tube. In this way, a simpler and more efficiently cooled structure can ensue given especially thick, highly stressed individual conductors for gradient coils, in comparison to the larger structure of the individual conductor arrangement according to FIGS. 1 and 2. The connection of a number of such individual conductors to form a component part as in FIGS. 2 and 3, possibly with the double conductors according to FIGS. 2 and 3 disposed above one another as well, is simpler in terms of manufacturing technology and yields even more efficient cooling since the paths from the creation of the heat in the conductor to the coolant in the cooling channel 6 of the cooling tube are smaller.

Water is generally used as the coolant in the inventive conductive structure.

Figure 5:
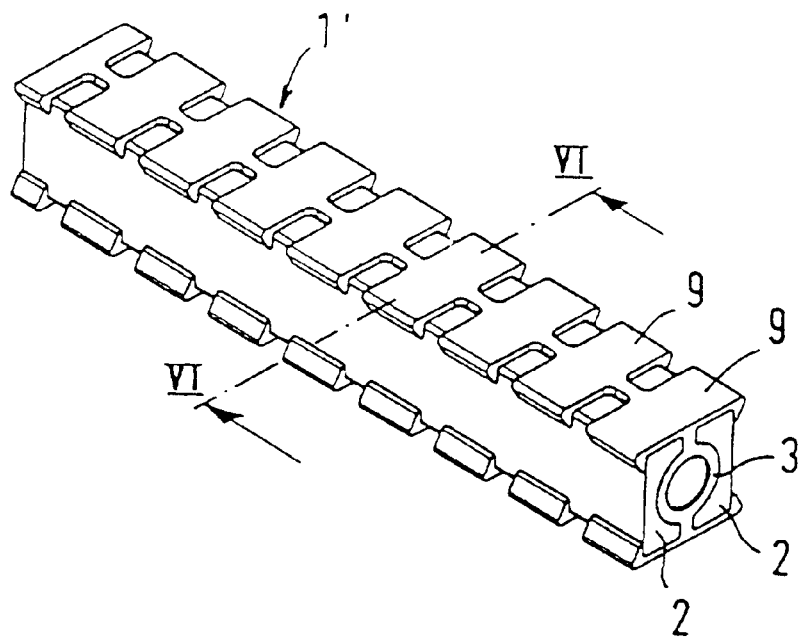
FIG. 5 shows an embodiment of an inventive segmented conductor having hooked webs surrounding the conductor segments in retaining fashion.
Figure 6:
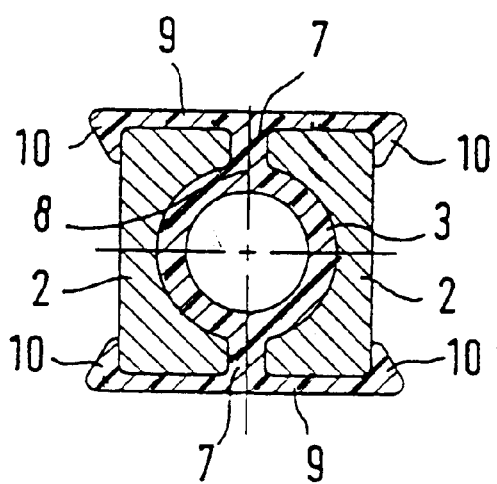
FIG. 6 is a section along the line VI—VI in FIG. 5.

The directly cooled conductor according to FIGS. 5 and 6 has a cooling tube 3 with longitudinal webs 7 which are offset by 180° relative to one another, to which hooked cross-webs 9 proceeding vertically to the center plane 8 of the longitudinal webs are attached. These cross-webs 9 embrace, and thus hold together, the profiled segments 2 with their hooks 10. A separate connection of the parts to one another, as in the exemplary embodiment according to FIGS. 1 through 4, thus is not required in the arrangement according to FIGS. 5 and 6. Due to the spacing of the hooked cross-webs 9, a structure is achieved that can be easily or curved bent, so that the simple-shape-retaining bendability with tight bending radii of the metallic profiled segments 2 is still also assured for the entire, directly cooled conductor with the cooling tube and the applied webs.

Figure 7:
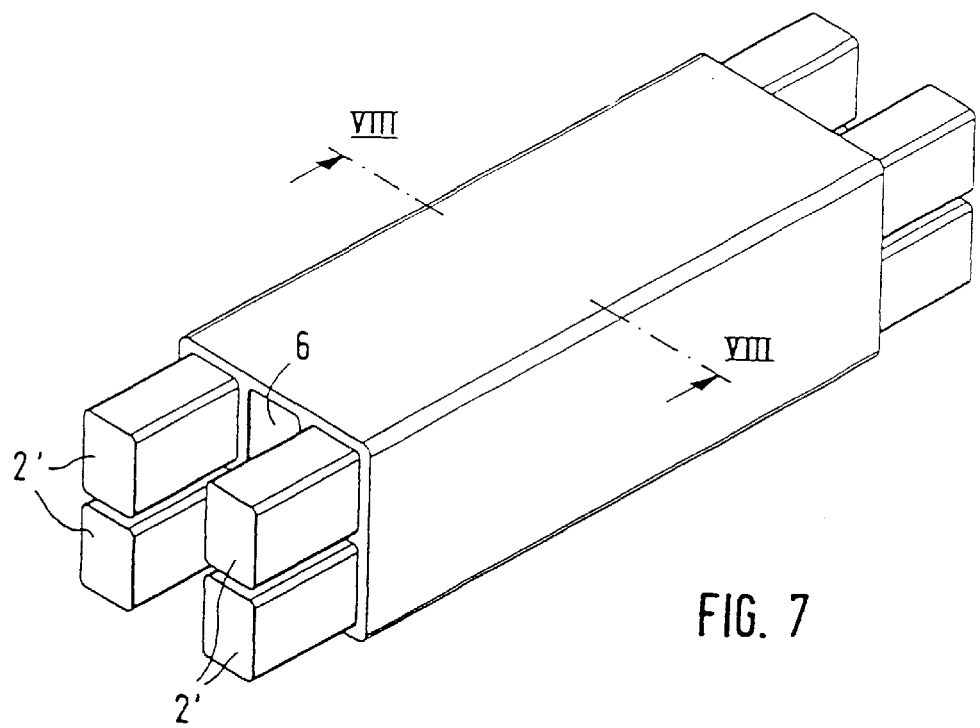
FIG. 7 is a perspective view of an embodiment of an inventive conductor with a rectangular cooling tube and surrounding tube profiles for the interlocking acceptance of the profiled segments of the conductor.
Figure 8:
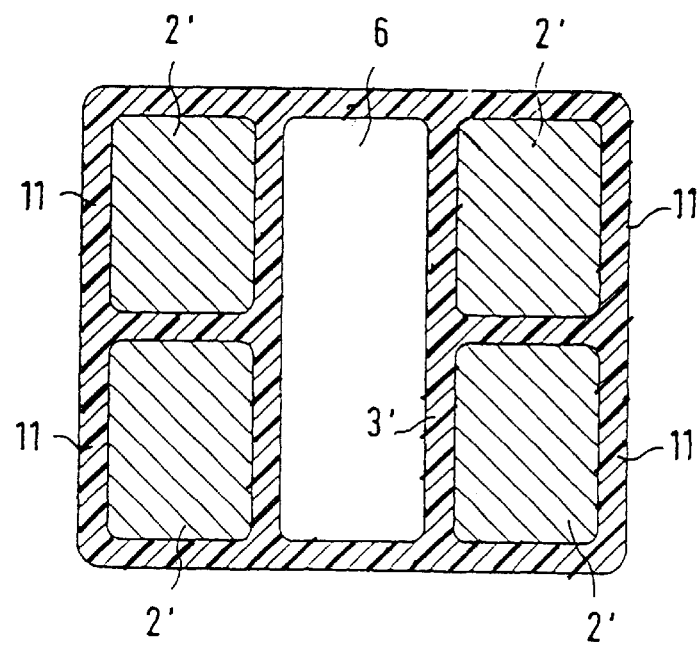
FIG. 8 is a cross-section along the line VIII—VIII in FIG. 7.

A modified embodiment of an inventive, directly cooled conductor having an inside cooling channel 6 and a holder for the profiled segments 2' is shown in FIGS. 7 and 8. The generally rectangular cooling tube 3' is thereby surrounded by four, laterally adjoining tube profiles 11 that form a smooth rectangular outside contour in common with the cooling tube 3'. This outside contour is quadratic in the illustrated exemplary embodiment. This structure with the embedded profiled segments 2' can be produced in an extrusion process.

Figure 9:
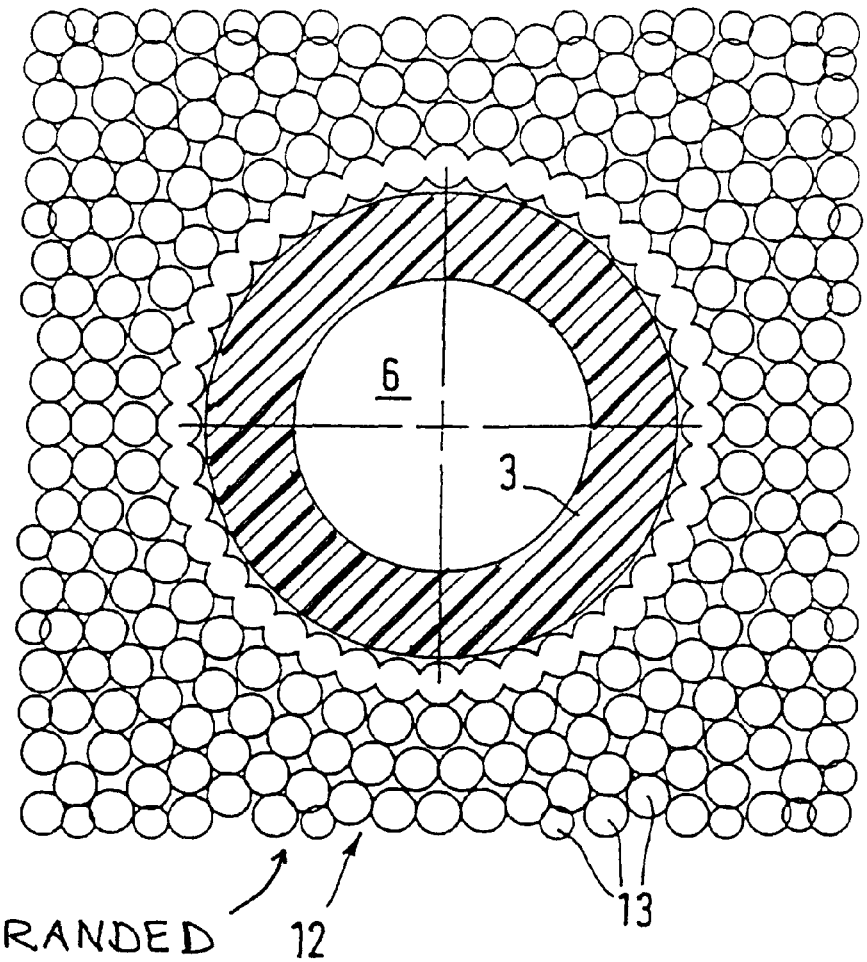
FIG. 9 shows another embodiment of an inventive conductor, wherein a stranded conductor is spun around and the cooling tube.

FIG. 9 shows an embodiment of an inventive conductor in cross-section wherein the cooling tube 3, is embedded in a stranded conductor 12, produced by spinning the individual strands 13 of the stranded conductor 12 around and on the cooling tube 3. This embodiment, however, is less beneficial than the versions disclosed above in view of the heat transfer from the outer strands to the coolant flowing in the cooling channel 6. The advantage of this exemplary embodiment is a low electrical resistance at high frequencies due to the division of the total coil current into many individual currents respectively flowing through the strands 13.

Although modifications and changes may be suggested by those skilled in the art, it is the intention of the inventors to embody within the patent warranted hereon all changes and modifications as reasonably and properly come within the scope of their contribution to the art.

We claim as our invention:

1. A directly cooled magnetic coil comprising:

a conductor forming a coil winding for a gradient coil for a magnetic resonance apparatus, said conductor comprising at least two profiled electrical conductor segments which when fitted together, form an opening said conductor being adapted to carry a gradient current for operating said gradient coil, and a cooling tube disposed permanently in said opening and surrounded by said profiled segment conductors, said cooling tube being comprised of a substantially electrically non-conductive, flexible material, said cooling tube being adapted to carry ion-containing water therein as a coolant for said gradient coil, and said electrically non-conductive, flexible material preventing electrical arcing between said conductor and said ion-containing water.

2. A directly cooled magnetic coil as claimed in claim 1 wherein said material comprises flexible plastic.

3. A directly cooled magnetic coil as claimed in claim 1 wherein said profiled segment conductors comprise rectangular rods, each having a channel with a semicircular cross-section, surrounding said cooling tube and interlocked with each other.

4. A directly cooled magnetic coil as claimed in claim 1 wherein each of said profiled segment conductors has an exterior, and wherein said directly cooled magnetic coil comprises a plurality of further individual conductors respectively attached to the respective exteriors of the profiled segment conductors.

5. A directly cooled magnetic coil comprising:

a conductor forming a coil winding comprising at least two profiled electrical conductor segments which when fitted together, form an opening, a cooling tube disposed permanently in said opening and surrounded by said profiled segment conductors, said cooling tube being comprised of a substantially electrically non-conductive, flexible material, and said profiled segment conductors comprising rectangular rods, and each having a channel with a semi-circular cross-section, surrounding said cooling tube and interlocked with each other.

6. A directly cooled magnetic coil as claimed in claim 5 wherein said material comprises flexible plastic.

* * * * *